(12) United States Patent
Choi

(10) Patent No.: US 7,891,501 B2
(45) Date of Patent: Feb. 22, 2011

(54) SHELF UNIT FOR USE IN RACK FOR COMMUNICATION EQUIPMENT

(76) Inventor: Byung Hyuk Choi, Lotte-Nakcheondae Apt. 104-1201, Chowol-eup, Ssangdong-ri, Gwangju-si, Gyeonggi-do 464-763 (KR)

( * ) Notice: Subject to any disclaimer, the term of this patent is extended or adjusted under 35 U.S.C. 154(b) by 1038 days.

(21) Appl. No.: 10/568,130

(22) PCT Filed: Sep. 24, 2004

(86) PCT No.: PCT/KR2004/002473

§ 371 (c)(1),
(2), (4) Date: Nov. 7, 2006

(87) PCT Pub. No.: WO2005/032161

PCT Pub. Date: Apr. 7, 2005

(65) Prior Publication Data

US 2007/0039901 A1    Feb. 22, 2007

(30) Foreign Application Priority Data

Sep. 30, 2003   (KR) .................. 10-2003-0067732

(51) Int. Cl.
*A47F 7/00* (2006.01)
(52) U.S. Cl. ............................................... 211/26
(58) Field of Classification Search .................. 211/26, 211/182, 41.17, 189; 361/725, 727, 829; 312/257.1; 206/710
See application file for complete search history.

(56) References Cited

U.S. PATENT DOCUMENTS

| | | | | |
|---|---|---|---|---|
| 3,470,330 A | * | 9/1969 | Brown | 379/454 |
| 5,242,061 A | * | 9/1993 | Lin | 211/41.17 |
| 5,584,396 A | * | 12/1996 | Schmitt | 211/26 |
| 5,697,811 A | * | 12/1997 | Pickles et al. | 439/532 |
| 5,765,698 A | * | 6/1998 | Bullivant | 211/26 |
| 5,831,821 A | * | 11/1998 | Scholder et al. | 361/679.32 |
| 5,907,614 A | | 5/1999 | Bergstrom et al. | |
| 5,947,570 A | * | 9/1999 | Anderson et al. | 312/223.2 |
| 5,988,409 A | | 11/1999 | Gusdorf et al. | |
| 6,118,668 A | * | 9/2000 | Scholder et al. | 361/753 |
| 6,169,987 B1 | | 1/2001 | Knoblock et al. | |

(Continued)

FOREIGN PATENT DOCUMENTS

KR    20030044297    6/2003

OTHER PUBLICATIONS

International Search Report WO2005/032161, Dec. 17, 2004.

*Primary Examiner*—Sarah Purol
(74) *Attorney, Agent, or Firm*—McDonnell Boehnen Hulbert & Berghoff LLP

(57) ABSTRACT

A shelf unit for use in a rack for communication equipment comprising: a front body including a pair of side panels for containing PCBs; a back board detachably mounted to the rear ends of the side panels of the front body; and a rear body including a pair of side panels for containing PCBs. Connecting members are mounted adjacent to the rear ends of the side panels of the front body and protrude outward therefrom. A pair of connecting plates extends forward from the front ends of the respective side panels of the rear body. L-shaped slots are provided at the connecting plates, into which the respective connecting members are fitted.

14 Claims, 4 Drawing Sheets

U.S. PATENT DOCUMENTS

| | | | |
|---|---|---|---|
| 6,279,754 B1* | 8/2001 | Hoss et al. | 211/26 |
| 6,318,680 B1* | 11/2001 | Benedict et al. | 248/49 |
| 6,418,011 B2* | 7/2002 | Omori | 361/679.33 |
| 6,659,292 B2* | 12/2003 | Gough et al. | 211/26 |
| 6,967,283 B2* | 11/2005 | Rasmussen et al. | 174/50 |
| 6,968,958 B2* | 11/2005 | Lauchner et al. | 211/26 |
| 7,206,200 B2* | 4/2007 | Chung | 361/679.39 |
| 7,210,586 B2* | 5/2007 | Ice | 211/26 |
| 7,542,269 B2* | 6/2009 | Chen et al. | 361/679.02 |
| 7,589,960 B2* | 9/2009 | Li | 361/679.33 |
| 2002/0179547 A1* | 12/2002 | Patriche et al. | 211/26 |
| 2003/0116515 A1* | 6/2003 | Ureshino | 211/41.17 |
| 2004/0031767 A1* | 2/2004 | Ice | 211/26 |
| 2005/0067358 A1* | 3/2005 | Lee et al. | 211/26 |
| 2006/0213848 A1* | 9/2006 | Kim et al. | 211/90.01 |
| 2007/0039901 A1* | 2/2007 | Choi | 211/26 |
| 2007/0119791 A1* | 5/2007 | Jeong | 211/26 |
| 2007/0119792 A1* | 5/2007 | Hendrix et al. | 211/26 |
| 2007/0256990 A1* | 11/2007 | Chen | 211/26 |
| 2009/0178986 A1* | 7/2009 | Coglitore et al. | 211/26 |

* cited by examiner

[Fig. 1]
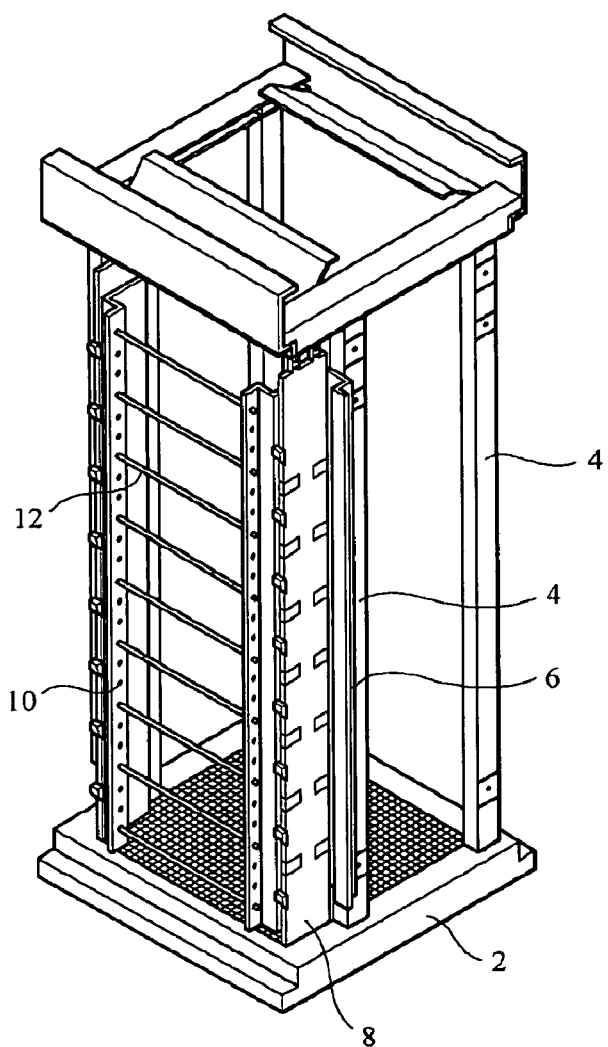
[Fig. 2]
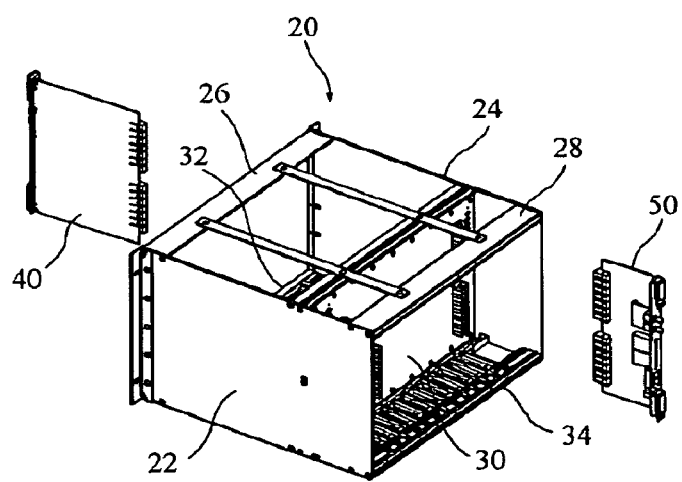

[Fig. 3]
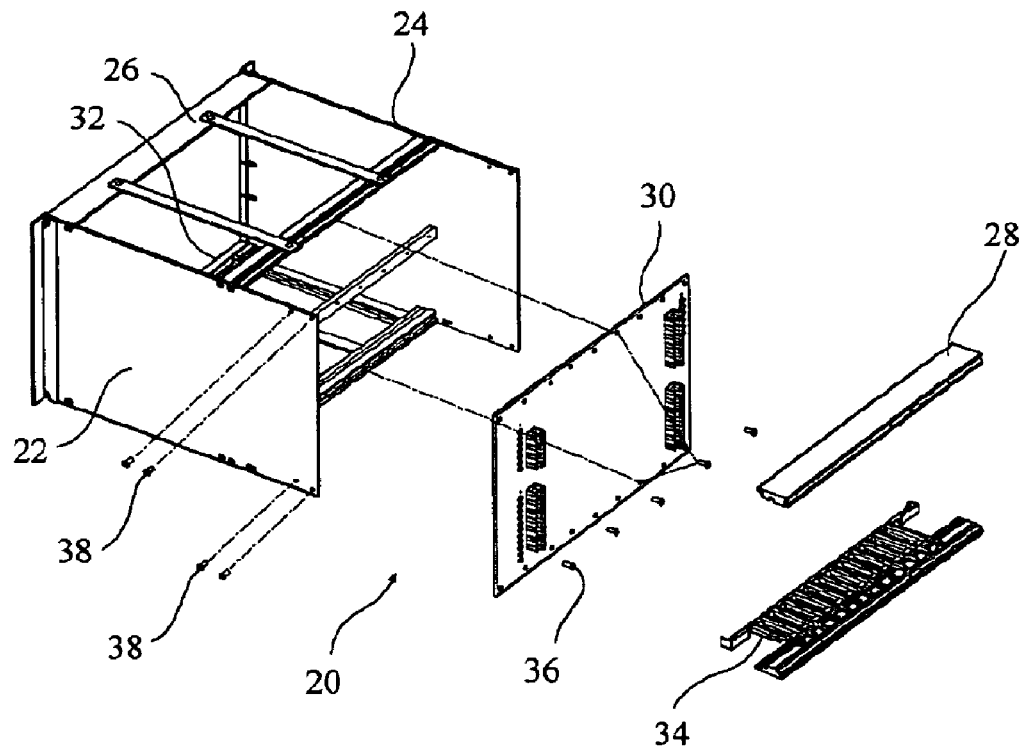
[Fig. 4]
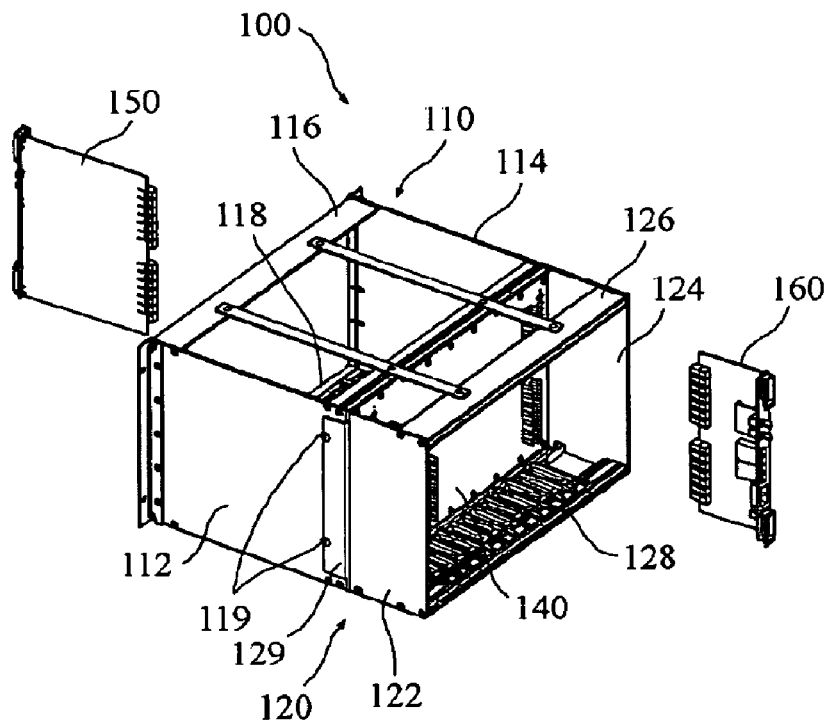

[Fig. 5]
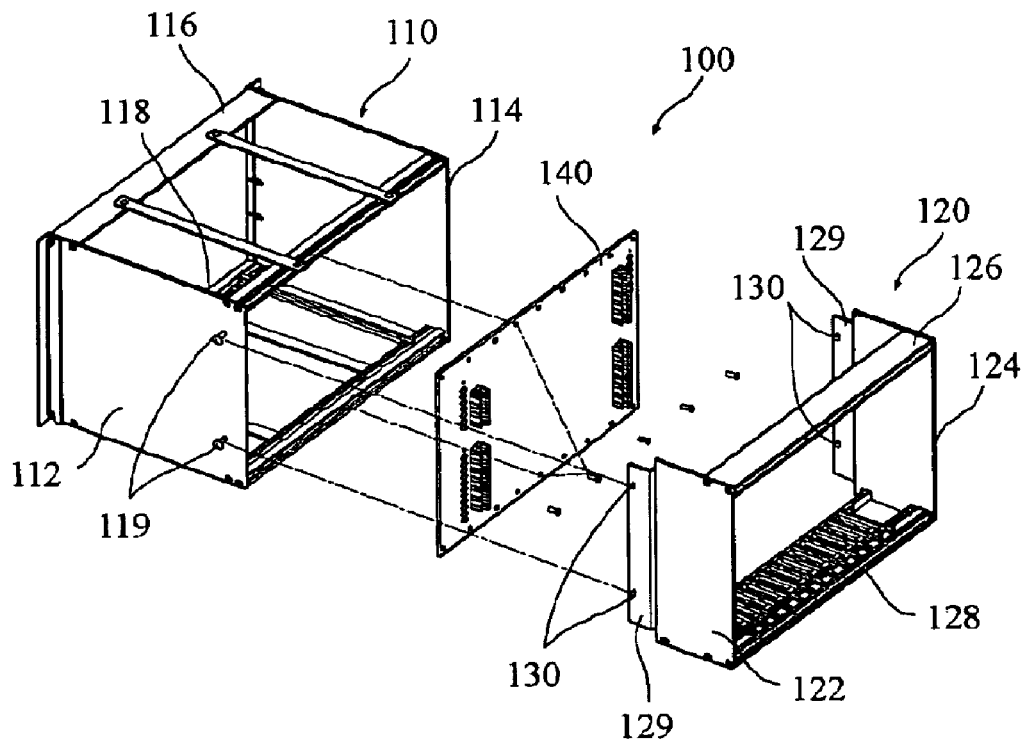
[Fig. 6]
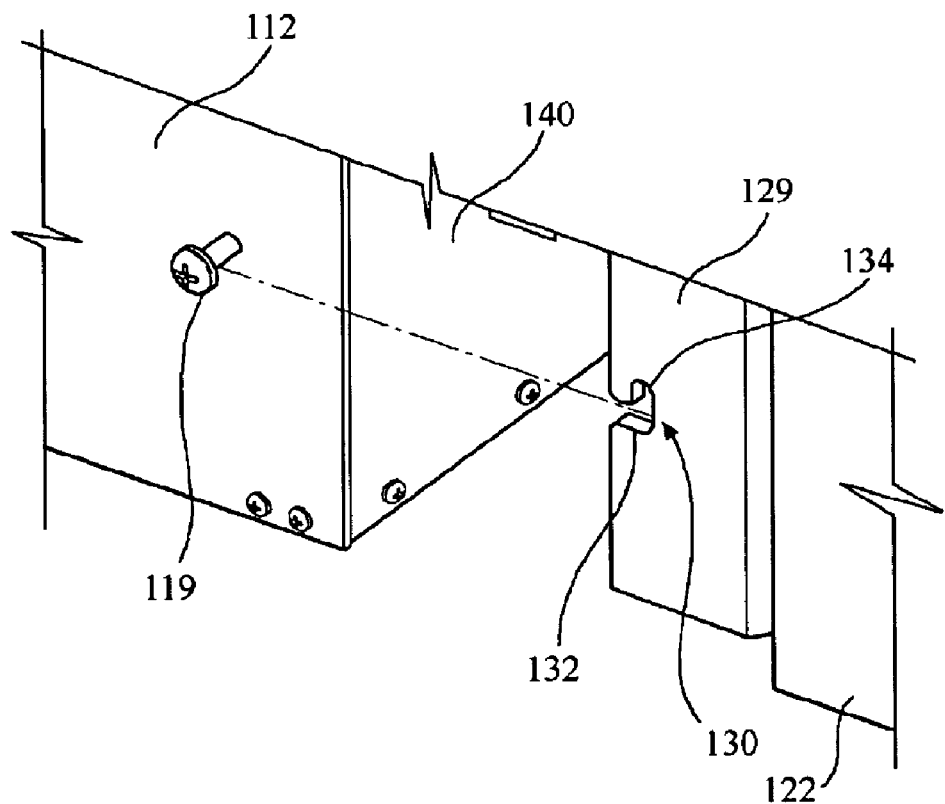

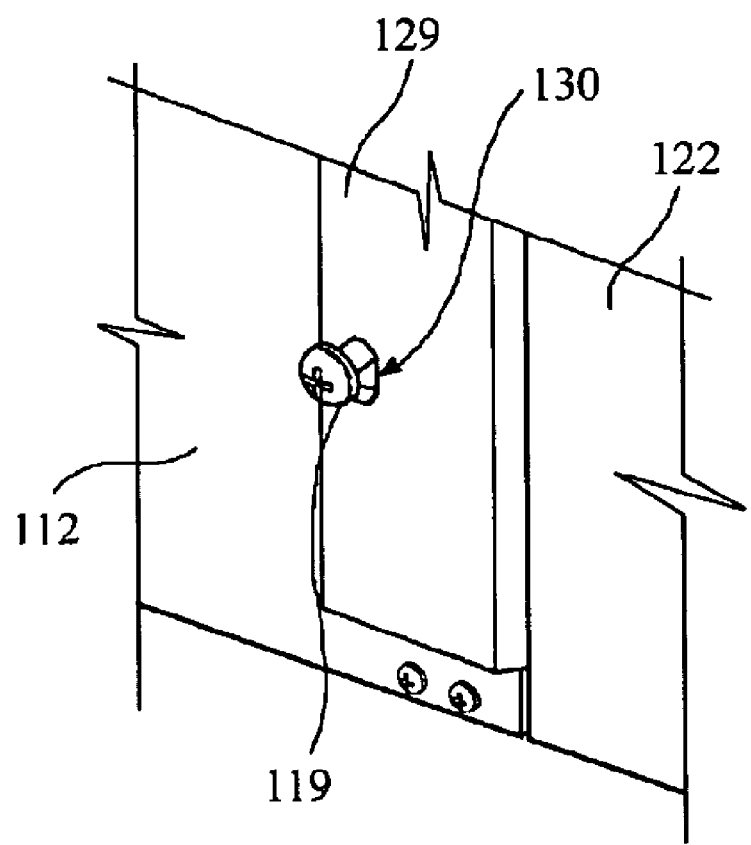
[Fig. 7]

SHELF UNIT FOR USE IN RACK FOR COMMUNICATION EQUIPMENT

TECHNICAL FIELD

The present invention generally relates to a shelf unit for use in a rack for communication equipment, and more particularly to a shelf unit for use in a rack for communication equipment that is designed to facilitate the demounting and remounting of a back board for repairs or maintenances.

BACKGROUND ART

FIG. 1 is a perspective view illustrating a conventional rack for communication equipment.

As shown in the drawing, a conventions rack 1 for communication equipment includes a rectangular base plate 2 and posts 4 that are mounted vertically on the base plate 2. Reinforcing plates 6 are attached to the posts 4 and bus bars 8 are fixed to the reinforcing plates 6.

A plurality of through-holes 10 is provided at the reinforcing plates 6 in a vertical line. Two groups of through-holes 10 provided at the respective reinforcing plates 6 are opposed to each other. Further, a plurality of cabling bars 12 is mounted to the reinforcing plates 6 in such a manner that both end portions of each cabling bar 12 are fitted through the two opposite through-holes 10.

A plurality of shelf units for storing communication equipment are mounted in the rack 1, which will be described with reference to FIGS. 2 and 3. A shelf unit 20 comprises a pair of side panels 22 and 24. It further comprises supporting plates 26 and 28 that are mounted to the top of the front and rear end portions of the side panels 22 and 24 for supporting them.

Front PCBs (printed circuit board) 40, which include a power unit and a PBA (printed board assembly) unit, are mounted in the front-half portion of the shelf unit 20. A back board 30, to which the front PCBs 40 are connected, is mounted in the central portion of the shelf unit 20. Rear PCBs 50 are mounted in the rear-half portion of the shelf unit 20 and connected to the back board 30. In order to support the front and rear PCBs 40 and 50, PCB guides 32 and 34 are mounted at the bottom of the front and rear end portions of the side panels 22 and 24. All components described above are coupled to one another by means of screws 36 and 38.

A procedure of demounting the back board 30 from the conventional shelf unit 20 is explained as follows. First, the front PCBs 40 and rear PCBs 50 are removed from the back board 30. Secondly, the screws 38 for fixing the supporting plate 28 and PCB guide 34 to the side panels 22 and 24 are released to separate the supporting plate 28 and PCB guide 34 from the side panels 22 and 24. Finally, the screws 36 for fixing the back board 30 to the shelf unit 20 are released to separate the back board 30 from the shelf unit 20.

Remounting the back board 30, supporting plate 28 and PCB guide 34 to the shelf unit 20 can be achieved according to the order that is reverse to the above-mentioned demounting procedure.

However, when demounting and remounting the back board from and to the shelf unit for repairs or maintenances, there is a problem in that a worker must also demount and remount other elements (e.g., the supporting plate, the PCB guide, etc.) by releasing and fastening a plurality of screws by hand. Therefore, it takes much time and labor to repair or replace the back board.

Further, it is very troublesome for the worker to align the screw holes of two corresponding elements when screwing them together.

DISCLOSURE OF INVENTION

Technical Problem

The object of the present invention is to provide a shelf unit for use in a rack for communication equipment that is designed to facilitate the demounting and remounting of a back board from and to the shelf unit for repairs or maintenances.

Technical Solution

To accomplish the above-mentioned object, there is provided a shelf unit for use in a rack for communication equipment, comprising: a front body, which includes (1) a pair of side panels having front and rear ends and defining a space for containing PCBs, and (2) connecting members mounted adjacent to the rear ends of the side panels and protruding outward from the side panels; a back board, to which the PCBs are connected, detachably mounted to the rear ends of the side panels of the front body; and a rear body, which includes (1) a pair of side panels having front and rear ends and defining a space for containing PCBs connected to the back board, (2) a pair of connecting plates extending forward from the front ends of the side panels and having a distance therebetween so that the connecting plates are in close contact with outer surfaces of the side panels of the front body, and (3) slots provided at the connecting plates into which the respective connecting members are fitted.

Advantageous Effects

According to the features of the present invention, a front body and a rear body are provided separately and assembled or disassembled simply with or from each other by means of connecting members of the front body and slots of the rear body. Thus, a worker can easily demount and remount a back board which is provided between the front body and the rear body.

BRIEF DESCRIPTION OF THE DRAWINGS

The above object and features of the present invention will become more apparent from the following description of the preferred embodiments given in conjunction with the accompanying drawings.

FIG. 1 is a perspective view showing a conventions rack for communication equipment.

FIG. 2 is a perspective view showing a conventional shelf unit for use in a rack for communication equipment.

FIG. 3 is an exploded perspective view showing the shelf unit depicted in FIG. 2.

FIG. 4 is a perspective view showing a shelf unit for use in a rack for communication equipment in accordance with a preferred embodiment of the present invention.

FIG. 5 is an exploded perspective view showing the shelf unit depicted in FIG. 4.

FIG. 6 is an enlarged view showing a connecting member and a connecting plate of the shelf unit.

FIG. 7 is an enlarged view showing a coupling state of the connecting member and the connecting plate of the shelf unit.

BEST MODE FOR CARRYING OUT THE INVENTION

The embodiment of the present invention will be readily understood as generally described and illustrated in the Figures provided herein and the accompanying text according to the above-identified technical scope of the present invention.

FIG. 4 is a perspective view showing a shelf unit in accordance with a preferred embodiment of the present invention. FIG. 5 is an exploded perspective view showing the shelf unit depicted in FIG. 4.

As shown in the drawings, a shelf unit 100 according to the present invention comprises (1) a front body 110 in which front PCBs 150 are mounted, (2) a back board 140 which are fixed to the rear end of the front body 110 by means of screws, and (3) a rear body 120 detachably combined with the front body 110, in which the rear PCBs 160 are mounted. The front and rear PCBs 150 and 160 are connected to the back board 140.

The front body 110 includes (1) a pair of side panels 112 and 114 defining a space for containing the front PCBs 150, (2) a supporting plate 116 mounted at the top of the front end portion of the side panels 112 and 114 for supporting them, (3) a PCB guide 118 mounted at the bottom of the side panels 112 and 114 for guiding the front PCBs 150, and (4) connecting members 119 mounted adjacent to the rear end portions of the side panels 112 and 114. Each connecting member 119 protrudes outward from the side panels 112 and 114 by a predetermined height. Preferably, the connecting member 119 is implemented as a screw, which is fastened into the side panels 112 and 114 of the front body 110 by a certain depth.

The rear body 120 includes (1) a pair of side panels 122 and 124 defining a space for containing rear PCBs 160, (2) a supporting plate 126 mounted at the top of the rear end portion of the side panels 122 and 124 for supporting then, (3) a PCB guide 128 mounted at the bottom of the side panels 122 and 124 for guiding the rear PCBs 160, and (4) a pair of connecting plates 129 extending from the front ends of the respective side panels 122 and 124 toward the front body 110.

The pair of connecting plates 129 has such a distance therebetween that the connecting plates 129 are in close contact with the outer surfaces of the side panels 112 and 114 of the front body 110. Also, the connecting plates 129 are provided with L-shaped slots 130 into which the connecting members 119 formed at the side panels 112 and 114 of the front body 110 are fitted. This is so that the connecting plates 129 become hung by the connecting members 119.

As shown in FIG. 6, each L-shaped slot 130 has a horizontal portion 132 extending horizontally from the front end of the connecting plate 129 and a vertical portion 134 extending vertically upward from the end of the horizontal portion 132.

When assembling the shelf unit 100 of the present invention, the front and rear bodies 110 and 120, to which the supporting plates 116 and 126 and the PCB guides 118 and 128 are mounted, are provided preferentially.

Then, as shown in FIGS. 5 and 6, the back board 140 is mounted to the rear end portion of the front body 110 in an erected state by means of screws. Then, the rear body 120 is moved toward the front body 110 while the connecting plates 129 closely contact the side panels 112 and 114 of the front body 110 until the connecting members 119 protruding outward from the side panels 112 and 114 of the front body 110 enter into horizontal portions 132 of the L-shaped slots 130. In a state where the respective connecting members 119 of the front body 110 enter the ends of the horizontal portions 132 of the respective L-shaped slots 130 of the rear body 120, if the removing force applied to the rear body 120 is removed, then the rear body 120 becomes subjected to a downward force due to its own weight, in which the connecting members 119 proceed into vertical portions 134 of the L-shaped slots 130. As a result, the rear body 120 is combined with the front body 110 in such a manner that the connecting plates 129 of the rear body 120 are hung by the connecting members 119 of the front body 110, as shown in FIG. 7.

Accordingly, the front and rear bodies 110 and 120 can be easily disassembled simply by pulling the connecting plates 129 of the rear body 120 out of the connecting members 119 of the front body 110. This facilitates the procedures of demounting and remounting the back board 140 from and to the shelf unit 100 when there needs to be a repair or replacement.

While the present invention has been shown and described with respect to a particular embodiment of a shelf unit for use in a rack for communication equipment, it will be apparent to those skilled in the art that many changes and modifications may be made without departing from the scope of the invention as defined in the appended claims and those equivalent thereto.

INDUSTRIAL APPLICABILITY

As described above in detail, there is provided a shelf unit for use in a rack for communication equipment that includes a front body and a rear body which are provided separately and assembled or disassembled simply with or from each other by means of connecting members of the front body and L-shaped slots of the rear body. Thus, a worker can easily demount and remount a back board which is provided between the front body and the rear body. Accordingly, the time and labor required to repair or replace the back board can be significantly mitigated.

The invention claimed is:

1. A shelf unit for use in a rack for communication equipment, the shelf unit comprises:
    a front body, including a pair of side panels having front and rear ends and defining a space for containing front PCBs, and connecting members mounted adjacent to the rear ends of the side panels and protruding outward from the side panels;
    a back board including a front face and a rear face, wherein the front face is configured to connect to the front PCBs, the back board being detachably mounted to the rear ends of the side panels of the front body; and
    a rear body including a pair of side panels having front and rear ends and defining a space for containing rear PCBs, wherein the rear face of the back board is configured to connect to the rear PCBs, a pair of connecting plates extending from the front ends of the side panels and having a distance therebetween so that the connecting plates are in close contact with outer surfaces of the side panels of the front body, and slots provided at the connecting plates into which the respective connecting members are fitted.

2. The shelf unit of claim 1, wherein each of the slots has a substantially L-shaped configuration, which includes a horizontal portion extending horizontally from the front end of the connecting plate and a vertical portion extending vertically upward from the end of the horizontal portion.

3. The shelf unit of claim 1, wherein each of the connecting members is implemented as a screw, which is fastened into the side panels of the front body by the predetermined depth.

4. The shelf unit of claim 1, wherein the front body includes a PCB guide.

5. The shelf unit of claim 1, wherein the rear body includes a PCB guide.

6. The shelf unit of claim 1, wherein the shelf unit is mounted in a rack.

7. A shelf unit comprising:
    a front body having a front end, a rear end, and a connecting member, wherein the front body is configured for mounting a first set of PCBs;

a rear body having a front end, a rear end, and a connecting plate, wherein the rear body is configured for mounting a second set of PCBs; and a back board having a front face and a rear face, wherein when the back board is fixed to the rear end of the front body, the front face of the back board configured to connect to the first set of PCBs, the rear face of the back board configured to connect to the second set of PCBs; and, wherein the connecting member connects to the connecting plate to combine the front body with the rear body.

8. The shelf unit of claim 7, wherein the back board is fixed to the front body.

9. The shelf unit of claim 7, wherein a width dimension of the front body and the rear body are the same.

10. The shelf unit of claim 7, wherein the connecting plate fits over the outside of the front body and engages the connecting members.

11. A method comprising:

affixing a back board having a front face and a rear face to a front body having a front end, a rear end, and a connecting member, wherein the affixing is performed on the rear end of the front body;

fitting the connecting member to a connecting plate on a rear body having a front end and a rear end, wherein the front body and the rear body are combined via the connecting member and the connecting plate;

mounting a first PCB to the front body;

connecting the first PCB to the front face of the back board;

mounting a second PCB to the rear body; and connecting the second PCB to the rear face of the back board.

12. The method of claim 11 further including pulling apart the connecting plate and the connecting member to gain access to the back board.

13. The method of claim 11 further including pulling apart the connecting plate and the connecting member to replace the back board.

14. The method of claim 11 further including detaching the rear body from the front body and unfixing the back board from the front body.

* * * * *